US009768019B2

(12) United States Patent
Bae et al.

(10) Patent No.: US 9,768,019 B2
(45) Date of Patent: Sep. 19, 2017

(54) LASER CRYSTALLIZATION METHOD

(71) Applicant: SAMSUNG DISPLAY CO., LTD., Yongin-si, Gyeonggi-Do (KR)

(72) Inventors: Joon-Hwa Bae, Suwon-si (KR); Byoung Kwon Choo, Hwaseong-si (KR); Jeong Kyun Na, Suwon-si (KR); Byoung Ho Cheong, Yongin-si (KR); Joo Woan Cho, Seongnam-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/158,755

(22) Filed: May 19, 2016

(65) Prior Publication Data
US 2017/0125246 A1 May 4, 2017

(30) Foreign Application Priority Data
Nov. 3, 2015 (KR) ........................ 10-2015-0153920

(51) Int. Cl.
| | | |
|---|---|---|
| *H01L 21/20* | (2006.01) | |
| *H01L 21/268* | (2006.01) | |
| *H01L 33/58* | (2010.01) | |
| *H01L 21/339* | (2006.01) | |
| *H01L 21/84* | (2006.01) | |
| *H01L 21/02* | (2006.01) | |
| *H01L 21/3105* | (2006.01) | |
| *H01L 21/308* | (2006.01) | |
| *H01L 27/12* | (2006.01) | |

(52) U.S. Cl.
CPC .. *H01L 21/02675* (2013.01); *H01L 21/02532* (2013.01); *H01L 21/02592* (2013.01); *H01L 21/02672* (2013.01); *H01L 21/3086* (2013.01); *H01L 21/3105* (2013.01); *H01L 27/1281* (2013.01)

(58) Field of Classification Search
CPC ......... H01L 21/02532; H01L 21/02675; H01L 21/02422; H01L 29/04; H01L 27/1285; H01L 27/1296; H01L 21/0268
USPC .......... 257/59, 66, 69, 70; 438/89, 486, 487, 438/479
See application file for complete search history.

(56) References Cited

U.S. PATENT DOCUMENTS

| | | | | |
|---|---|---|---|---|
| 5,207,863 A | * | 5/1993 | Kumomi | ................. C30B 1/023 117/8 |
| 6,686,978 B2 | | 2/2004 | Voutsas | |
| 2006/0024858 A1 | * | 2/2006 | Kumomi | ................. C30B 13/24 438/89 |

(Continued)

FOREIGN PATENT DOCUMENTS

| | | |
|---|---|---|
| JP | 06-140321 | 5/1994 |
| KR | 1020000027349 | 5/2000 |
| KR | 1020050067741 | 7/2005 |

*Primary Examiner* — Kimberly Rizkallah
*Assistant Examiner* — Brian Turner
(74) *Attorney, Agent, or Firm* — F. Chau & Associates, LLC

(57) ABSTRACT

A laser crystallization method includes forming a plurality of first protrusions and depressions on a surface of an amorphous silicon layer, wherein a first protrusion and an adjacent first depression of the plurality of first protrusions and depressions, together, have a first pitch, and irradiating the amorphous silicon layer with a laser beam to form a polycrystalline silicon layer.

19 Claims, 13 Drawing Sheets

(56) References Cited

U.S. PATENT DOCUMENTS

| | | | | |
|---|---|---|---|---|
| 2007/0114449 A1* | 5/2007 | Nakayama | ............. | G01B 15/00 |
| | | | | 250/491.1 |
| 2010/0055611 A1* | 3/2010 | Kim | ...................... | B82Y 10/00 |
| | | | | 430/280.1 |
| 2010/0112790 A1* | 5/2010 | Sugahara | .......... | H01L 21/02532 |
| | | | | 438/479 |
| 2011/0140303 A1* | 6/2011 | Jang | ...................... | B82Y 10/00 |
| | | | | 264/293 |
| 2011/0195141 A1* | 8/2011 | Muhammad | ........... | B82Y 10/00 |
| | | | | 425/385 |
| 2015/0091010 A1* | 4/2015 | Wang | ................ | H01L 21/02686 |
| | | | | 257/59 |
| 2015/0194310 A1* | 7/2015 | Zhang | ................. | H01L 27/1281 |
| | | | | 257/66 |

* cited by examiner

LASER CRYSTALLIZATION METHOD

CROSS-REFERENCE TO RELATED APPLICATION

This application claims priority under 35 U.S.C. §119 to Korean Patent Application No. 10-2015-0153920, filed in the Korean Intellectual Property Office on Nov. 3, 2015, the contents of which are incorporated by reference herein in their entirety.

TECHNICAL FIELD

The present invention relates to a laser crystallization method.

DISCUSSION OF THE RELATED ART

In general, methods of crystallizing an amorphous silicon layer into a polycrystalline silicon layer include solid phase crystallization (SPC), metal induced crystallization (MIC), metal induced lateral crystallization (MILC), excimer laser annealing (ELA), etc. In the manufacturing process of an organic light emitting diode (OLED) display or a liquid crystal display (LCD), ELA is used for crystallizing the amorphous silicon layer into the polycrystalline silicon layer by using a laser beam.

However, when an ELA process is used to form grains in the polycrystalline silicon layer, the grains may not be evenly spaced.

SUMMARY

According to an exemplary embodiment of the present invention, a laser crystallization method includes forming a plurality of first protrusions and depressions on a surface of an amorphous silicon layer, wherein a first protrusion and an adjacent first depression of the plurality of first protrusions and depressions, together, have a first pitch, and irradiating the amorphous silicon layer with a laser beam to form a polycrystalline silicon layer.

In an exemplary embodiment of the present invention, the forming of the plurality of first protrusions and depressions includes forming an insulating layer on the amorphous silicon layer, forming a plurality of openings having a first width on the insulating layer, and etching the surface of the amorphous silicon layer using the insulating layer as an etching mask.

In an exemplary embodiment of the present invention, the forming of the plurality of openings includes, pressing the insulating layer with a nanoimprinter having a plurality of second protrusions and depressions to form a plurality of grooves on the insulating layer, wherein a second protrusion and an adjacent second depression of the plurality of second protrusions and depressions, together, have the first pitch, and performing an ashing process to the insulating layer to change the plurality of grooves into the plurality of openings.

In an exemplary embodiment of the present invention, when the wavelength of the laser beam is referred to as $\lambda$, the first pitch is in a range from $\lambda-5$ nm to $\lambda+5$ nm.

In an exemplary embodiment of the present invention, the first protrusions and depressions include a convex portion and a recess portion disposed adjacent to the convex portion, wherein the first pitch is a sum of a width of the convex portion and a width of the adjacent recess portion.

In an exemplary embodiment of the present invention, a grain boundary of the polycrystalline silicon layer is formed at the convex portion of the first protrusions and depressions.

In an exemplary embodiment of the present invention, the first pitch is in a range of about 305 nm to about 312 nm.

In an exemplary embodiment of the present invention, the laser beam has a linear shape of which a length is longer than a width, the first protrusion and the adjacent first depression of the plurality of first protrusions and depressions have a linear shape of which a length is longer than the first pitch, and a direction in which the width of the laser beam is measured is parallel to a direction in which the first pitch is measured.

In an exemplary embodiment of the present invention, a wavelength of the laser beam is an integer multiple of the first pitch.

According to an exemplary embodiment of the present invention, a laser crystallization method includes forming a first convex portion, a first recess portion, and a second convex portion on a first surface of an amorphous silicon layer, wherein the first convex portion is adjacent to the first recess portion, and the first recess portion is adjacent to the second convex portion, and irradiating the amorphous silicon layer with a laser beam to form a polycrystalline silicon layer.

In an exemplary embodiment of the present invention, a first seed is generated in the first recess portion when the amorphous silicon layer is irradiated by the laser beam.

In an exemplary embodiment of the present invention, the first seed is grown into a first grain when the amorphous silicon layer is irradiated by the laser beam, and the first convex portion corresponds to a first boundary of the first grain.

In an exemplary embodiment of the present invention, the second convex portion corresponds to a second boundary of the first grain.

In an exemplary embodiment of the present invention, a first pitch includes a width of the first convex portion and a width of the first recess portion, and a wavelength of the laser beam equals the first pitch.

In an exemplary embodiment of the present invention, when a first pitch includes a width of the first convex portion and a width of the first recess portion, a wavelength of the laser beam is 307 nm and the first pitch ranges from 302 nm to 312 nm.

In an exemplary embodiment of the present invention, the laser crystallization method further includes forming a second recess portion adjacent to the second convex portion and forming a third convex portion adjacent to the second recess portion on the first surface of the of the amorphous silicon layer, wherein a second seed is generated in the second recess portion when the amorphous silicon layer is irradiated by the laser beam, wherein a first pitch includes a width of the first convex portion and a width of the first recess portion, and a second pitch which is equal to the first pitch includes a width of the second convex portion and a width of the second recess portion.

In an exemplary embodiment of the present invention, the first and second recess portions are closer to a second surface of the amorphous silicon layer than the first, second and third convex portions, wherein the first and second surfaces of the amorphous silicon layer are opposite with respect to each other.

In an exemplary embodiment of the present invention, when irradiating the amorphous silicon layer with the laser beam, a first temperature of a portion of the amorphous silicon layer corresponding to the first recess portion is lower than a second temperature of a portion of the amorphous silicon layer corresponding to the first convex portion.

According to an exemplary embodiment of the present invention, a laser crystallization method includes forming an amorphous silicon layer on a substrate, forming an insulating layer on the amorphous silicon layer, forming a plurality of first convex portions and a plurality of first recess portions on the insulating layer by pressing a nanoimprinter on the insulating layer, wherein the nanoimprinter has a plurality of second convex portions and a plurality of second recess portions that are equal to the plurality of first convex portions and the plurality of first recess portions, etching the amorphous silicon layer using the insulating layer as an etching mask, wherein a plurality of third recess portions and a plurality of third convex portions remain on the amorphous silicon layer after the etching of the amorphous silicon layer, and irradiating the amorphous silicon layer with a laser beam to form a polycrystalline silicon layer.

In an exemplary embodiment of the present invention, when a first pitch includes a width of a third recess portion of the plurality of third recess portions and a width of a third convex portion of the plurality of third convex portions, the first pitch ranges from 5 nm smaller than a wavelength of the laser beam to 5 nm greater than the wavelength of the laser beam.

BRIEF DESCRIPTION OF THE DRAWINGS

Hereinafter, the present invention will be described in detail with reference to the accompanying drawings, in which.

DETAILED DESCRIPTION OF THE EMBODIMENTS

Figure 1:
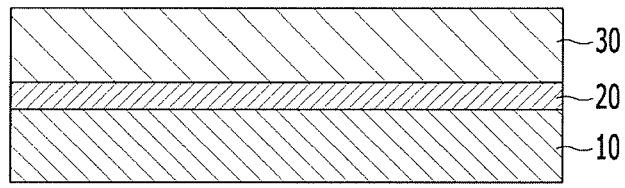
FIG. 1 to FIG. 7 are cross-sectional views sequentially illustrating a laser crystallization method according to an exemplary embodiment of the present invention.

The present invention will be described more fully hereinafter with reference to the accompanying drawings, in which exemplary embodiments thereof are shown. As those skilled in the art would realize, the disclosed embodiments may be modified in various different ways without departing from the spirit and scope of the present invention.

Like reference numerals may refer to like elements throughout the specification.

In addition, the size and thickness of each element shown in the drawings may be exaggerated for better understanding and ease of description, but the present invention is not limited thereto.

A laser crystallization method, according to an exemplary embodiment of the present invention, will be described with reference to accompanying drawings.

FIG. 1 to FIG. 7 are cross-sectional views sequentially illustrating a laser crystallization method according to an exemplary embodiment of the present invention.

As shown in FIG. 1, the laser crystallization method according to an exemplary embodiment of the present invention includes forming an amorphous silicon layer 20 on a substrate 10. The amorphous silicon layer 20 may be formed by a method such as low pressure chemical vapor deposition (LPCVD), atmospheric pressure chemical vapor deposition (APCVD), plasma enhanced chemical vapor deposition (PECVD), sputtering, vacuum evaporation, and the like. Also, an insulating layer 30 is formed on the amorphous silicon layer 20. The insulating layer 30 may be a photosensitive film.

Figure 2:
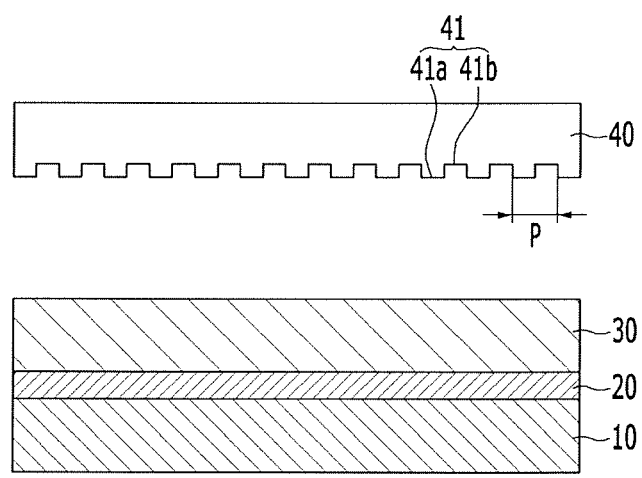

As shown in FIG. 2, a nanoimprinter 40 is positioned on the insulating layer 30. Second protrusions and depressions 41 having a pitch P of a nanometer size are formed in the nanoimprinter. The second protrusions and depressions 41 include a convex portion 41a and a recess portion 41b disposed adjacent to the convex portion 41a. According to an exemplary embodiment of the present invention, the nanometer size means a size of several hundred nanometers. According to an exemplary embodiment of the present invention, the pitch P may be about 305 nm to about 313 nm.

Figure 3:
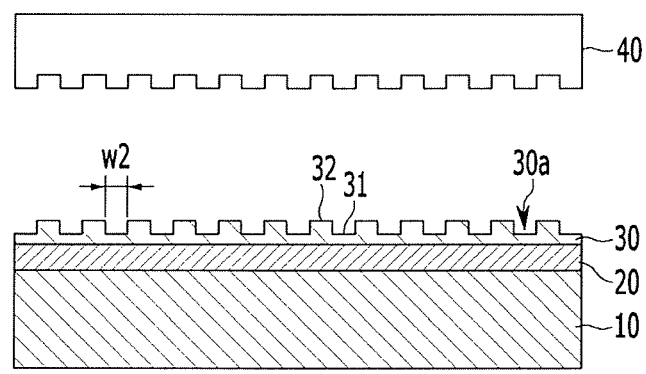

As shown in FIG. 3, the nanoimprinter 40 is pressed on the insulating layer 30 to form a plurality of grooves 30a having a second width w2 of the nanometer size on the insulating layer 30. According to an exemplary embodiment of the present invention, the second width w2 of the grooves 30a may be from about 150 nm to about 160 nm. After being pressed by the insulating layer 30, the nanoimprinter 40 is raised to be separated from the insulating layer 30. Accordingly, on the insulating layer 30, a recess portion 31 is formed at the position corresponding to the grooves 30a and a convex portion 32 is formed at a higher position of the insulating layer 30 than the recess portion 31.

Figure 4:
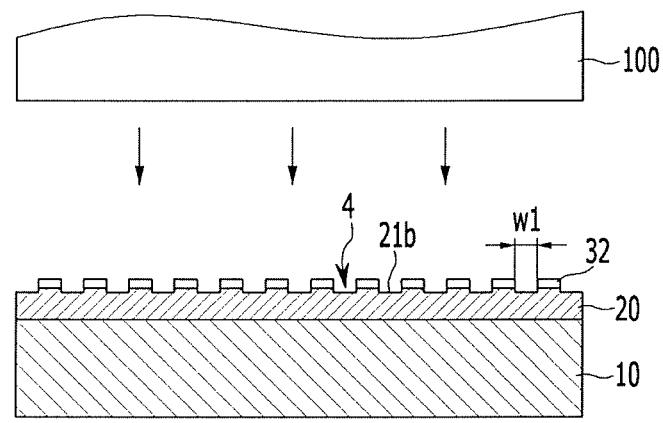

As shown in FIG. 3 and FIG. 4, an ashing process is executed on the insulating layer 30 to entirely etch the insulating layer 30. According to an exemplary embodiment of the present invention, when the ashing process is executed on the insulating layer 30, the recess portions 31 corresponding to the grooves 30a are completely etched while the convex portions 32 remain on the insulating layer 30 with a decreased height. Accordingly, a portion of the convex portions 32 remain, and the recess portions 31 corresponding to the grooves 30a are removed to form openings 4. Each of the plurality of openings 4 have a first width w1 of the nanometer size. In addition, the surface of the amorphous silicon layer 20 is etched by a dry etching device 100 using the insulating layer 30 as an etching mask. Accordingly, recess portions 21b are formed on the amorphous silicon layer 20.

Figure 5:
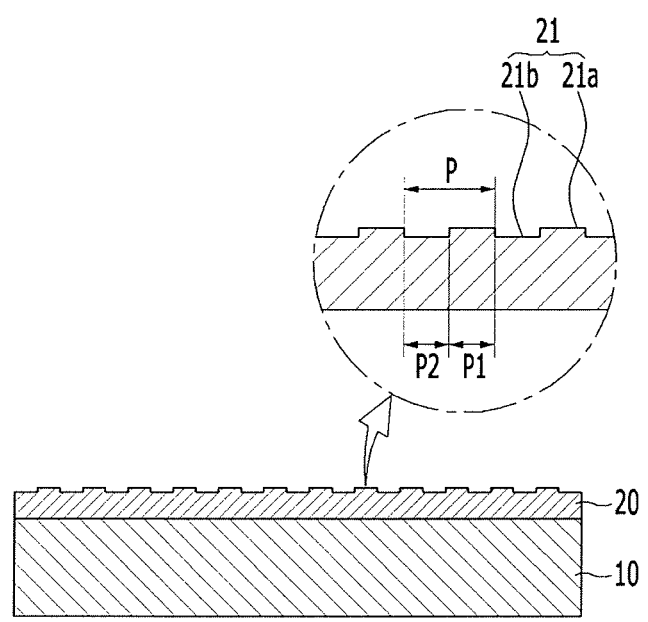

As shown in FIG. 5, the convex portions 32 of the insulating layer 30 are removed to expose the surface of the amorphous silicon layer 20. Accordingly, a plurality of first protrusions and depressions 21 having a pitch P of the nanometer size are formed on the surface of the amorphous silicon layer 20.

Each of the first protrusions and depressions 21 includes a convex portion 21a and a recess portion 21b that is lower in height than the convex portion 21a. In a first protrusion and depression 21, the convex portion 21a may be disposed adjacent to the recess portion 21b. The pitch P of one of the first protrusions and depressions 21 is a sum of a width P1 of a convex portion 21a and a width P2 of a recess portion 21b. The first protrusions and depressions 21 are repeated multiple times with the same pitch P on the surface of the amorphous silicon layer 20.

Figure 6:
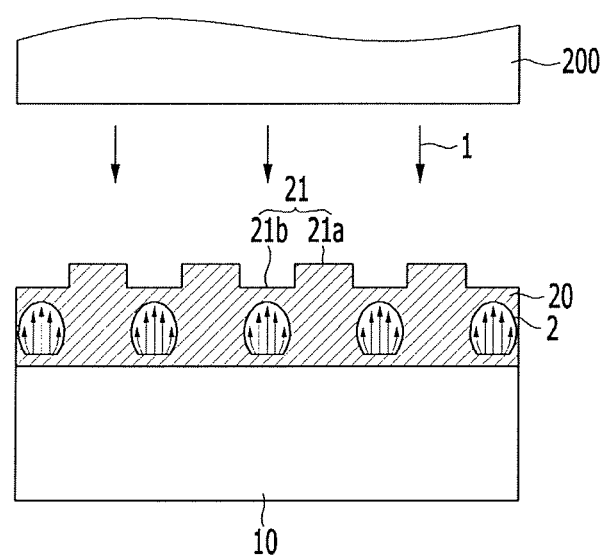

As shown in FIG. 6, the amorphous silicon layer 20 including the plurality of first protrusions and depressions 21 is irradiated by a laser beam 1 to generate a temperature gradient deviation inside the amorphous silicon layer 20. For example, the temperature of a portion of the amorphous silicon layer 20 corresponding to a recess portion 21b is lower than a temperature of a portion of the amorphous silicon layer 20 corresponding to a convex portion 21a. Accordingly, a seed 2 is generated at each portion of the amorphous silicon layer 20 corresponding to the recess portions 21b. Thus, the seeds 2 are generated at equal distances from each other (e.g., the seeds 2 are generated at a constant interval or uniform spacing) since the recess portions 21b are disposed at equal distances from each other.

Figure 7:
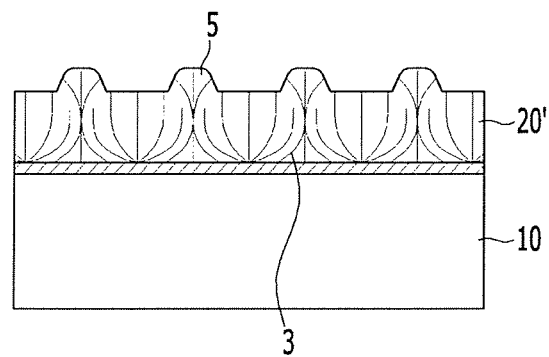

As described above, since the seeds 2 are generated with a constant interval, grains 3 generated from the seeds 2 may be uniformly spaced in the polycrystalline silicon layer 20' (refer to FIG. 7).

According to an exemplary embodiment of the present invention, the laser beam 1 may include an excimer laser 200.

As shown in FIG. 7, the seeds 2 are grown to form a polycrystalline silicon layer 20' of which the grains 3 are formed with the uniform interval. For example, the grains 3 may be equally spaced apart from each other. In this case, a grain boundary 5 is formed between adjacent grains 3. The grain boundary 5 is formed at the position of the polycrystalline silicon layer 20' corresponding to the convex portion 21a of the first protrusions and depressions 21. As described above, the grain boundary 5 is formed with the constant interval such that the polycrystalline silicon layer 20' may have uniformly spaced grains 3.

As described above, by forming the first protrusions and depressions 21 of the nanometer size in the amorphous silicon layer 20 to increase the temperature gradient deviation in the amorphous silicon layer 20, the uniformity of the polycrystalline silicon layer 20' may be increased.

Also, since the polycrystalline silicon layer having a high grain uniformity may be formed even if a number of irradiations of the amorphous silicon layer 20 is reduced, a manufacturing cost and a manufacturing time of the polycrystalline silicon layer 20' may be reduced. Thus, the production capacity of the laser crystallization device may be increased.

Figure 8:
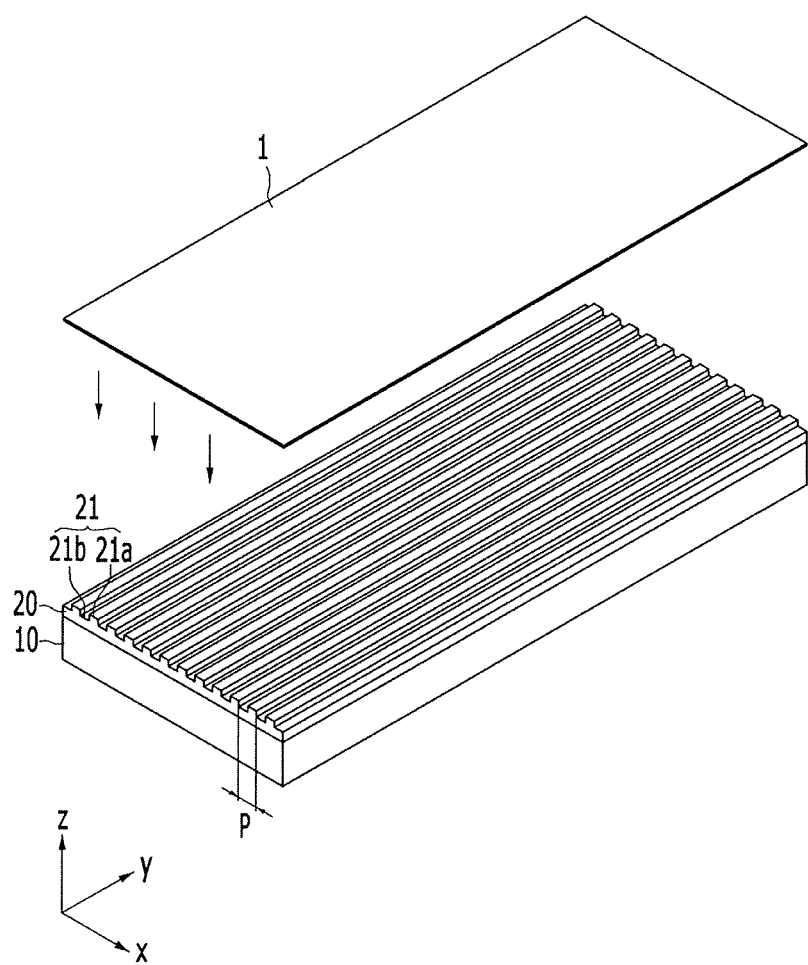
FIG. 8 is a perspective view illustrating a relationship between a laser beam and first protrusions and depressions according to an exemplary embodiment of the present invention.

FIG. 8 is a perspective view illustrating a relationship between a laser beam and first protrusions and depressions according to an exemplary embodiment of the present invention.

As shown in FIG. 8, the laser beam 1 may have a linear shape in which a length direction Y of the laser beam 1 is longer than a width direction X of the laser beam 1. The first protrusions and depressions 21 formed in the amorphous silicon layer 20 may have a linear shape in which the length direction Y of the first protrusions and depressions 21 is longer than a pitch P direction X of the first protrusions and depressions 21. Also, the width direction X of the laser beam 1 may be parallel to the pitch P direction X of the first protrusions and depressions 21. In other words, the length of both the laser beam 1 and the first protrusions and depressions 21 is measured along the direction Y, and the width of both the laser beam 1 and the first protrusions and depressions 21 is measured along the direction X.

When the wavelength of the laser beam 1 is referred to as λ, a pitch P of the first protrusions and depressions 21 may have a value between λ−5 nm and λ+5 nm. Accordingly, when the wavelength of the laser beam 1 is 307 nm, the pitch P of the first protrusions and depressions 21 may be from about 302 nm to about 312 nm.

Figure 9:
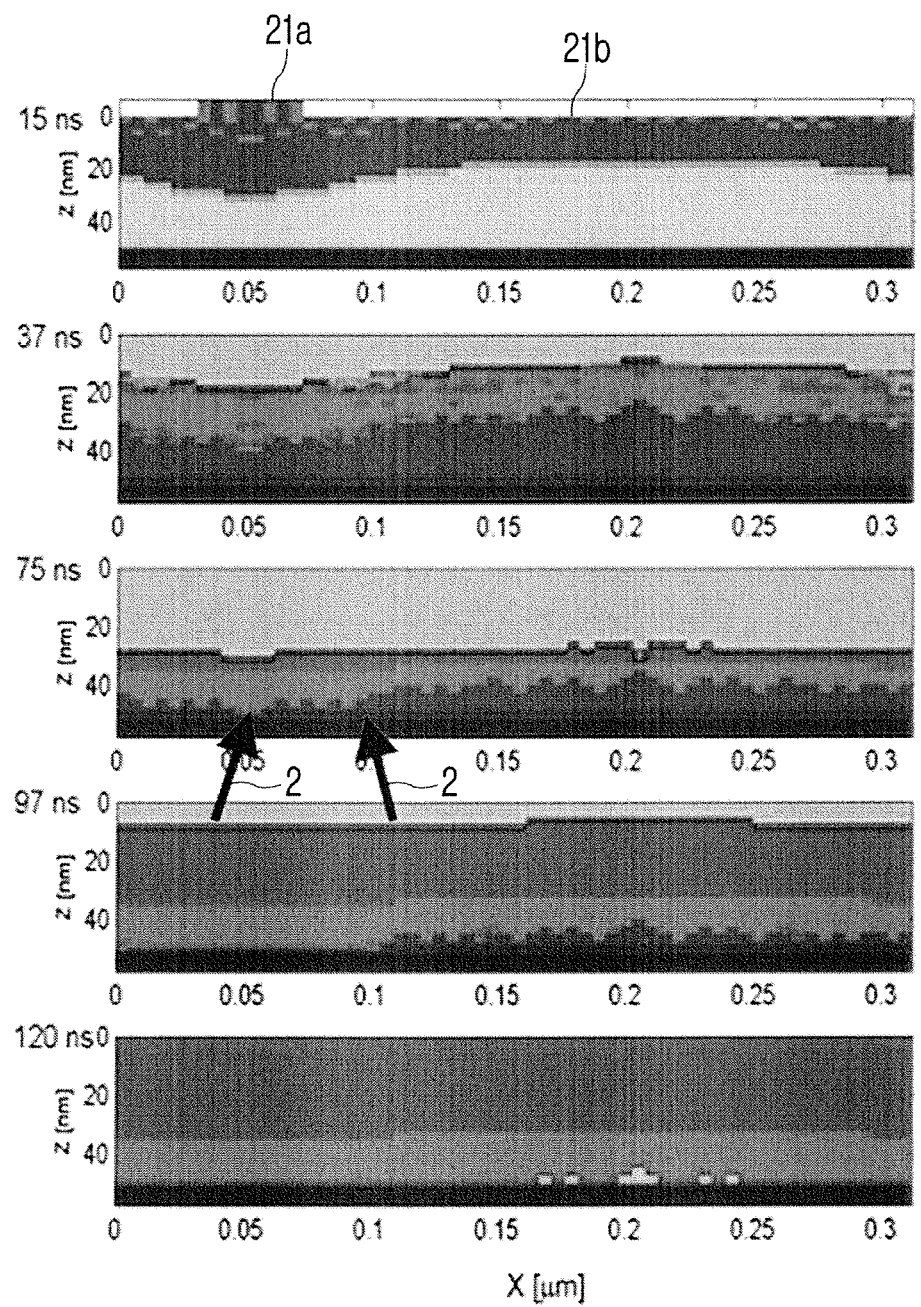
FIG. 9 is a view illustrating a crystallization state of a polycrystalline silicon layer when a pitch of first protrusions and depressions is the same as a wavelength of a laser beam, according to an exemplary embodiment of the present invention.
Figure 10:
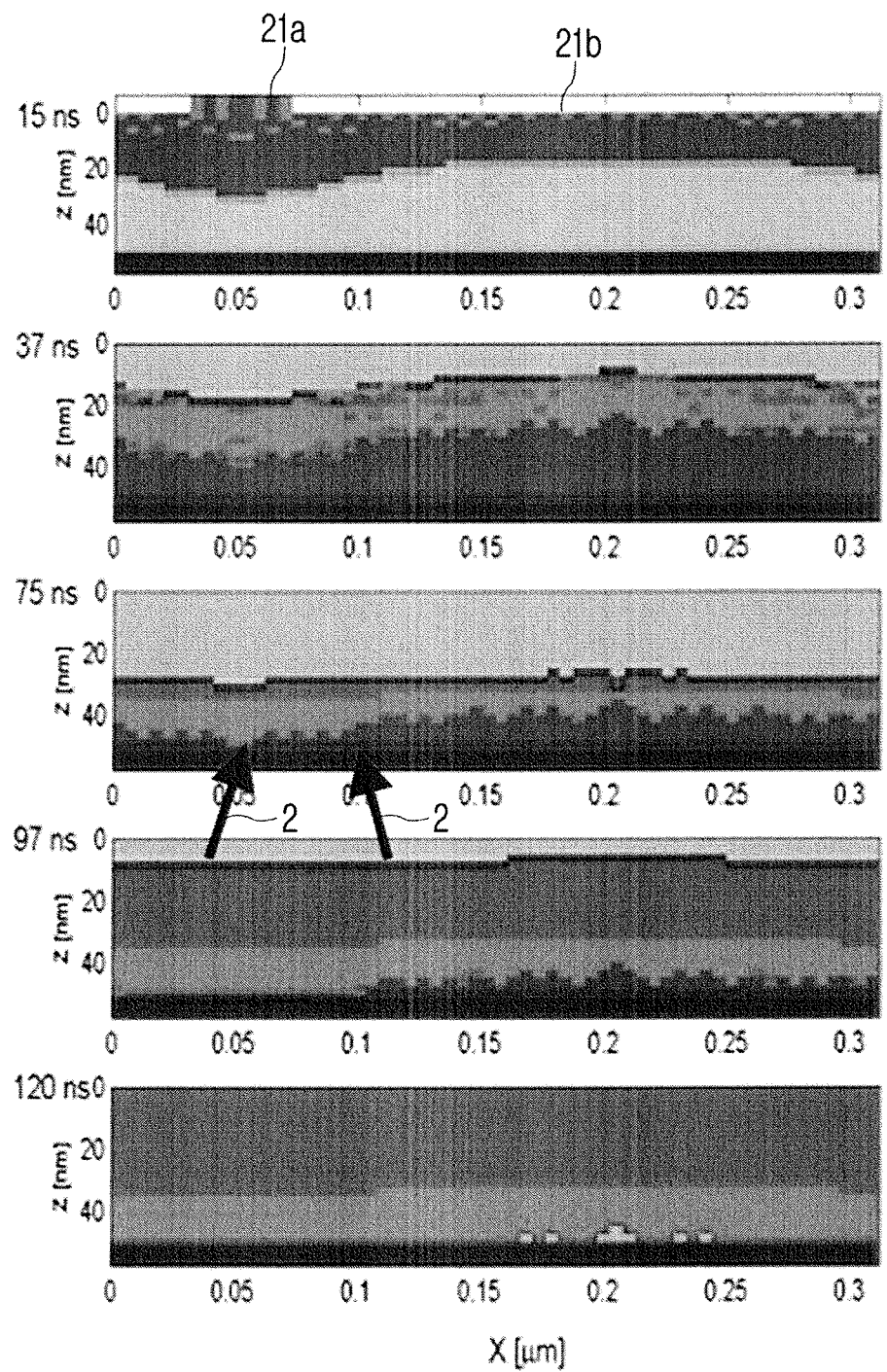
FIG. 10 is a view illustrating a crystallization state of a polycrystalline silicon layer when a pitch of a first protrusions and depressions is 302 nm, according to an exemplary embodiment of the present invention.
Figure 11:
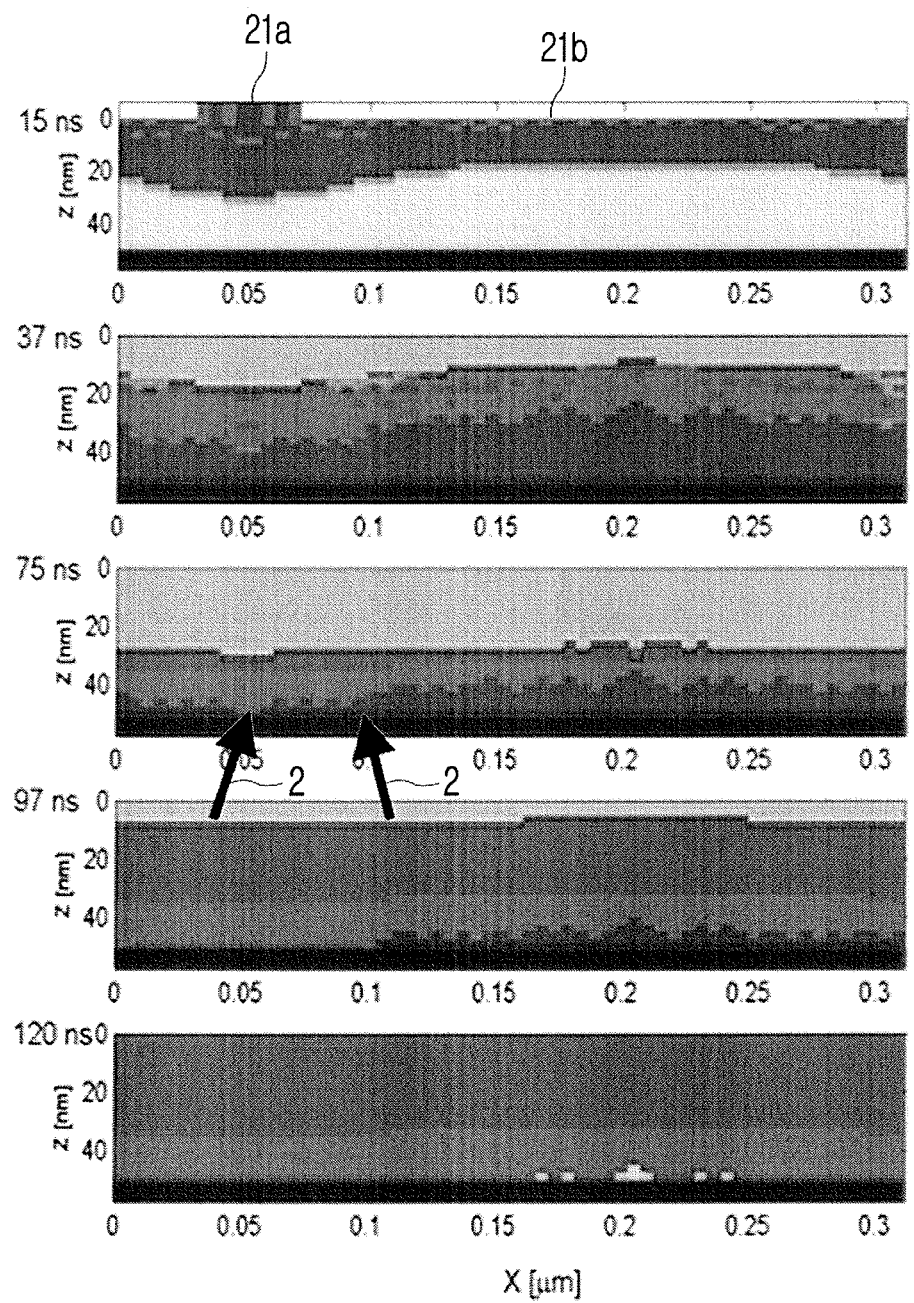
FIG. 11 is a view illustrating a crystallization state of a polycrystalline silicon layer when a pitch of first protrusions and depressions is 312 nm, according to an exemplary embodiment of the present invention.
Figure 12:
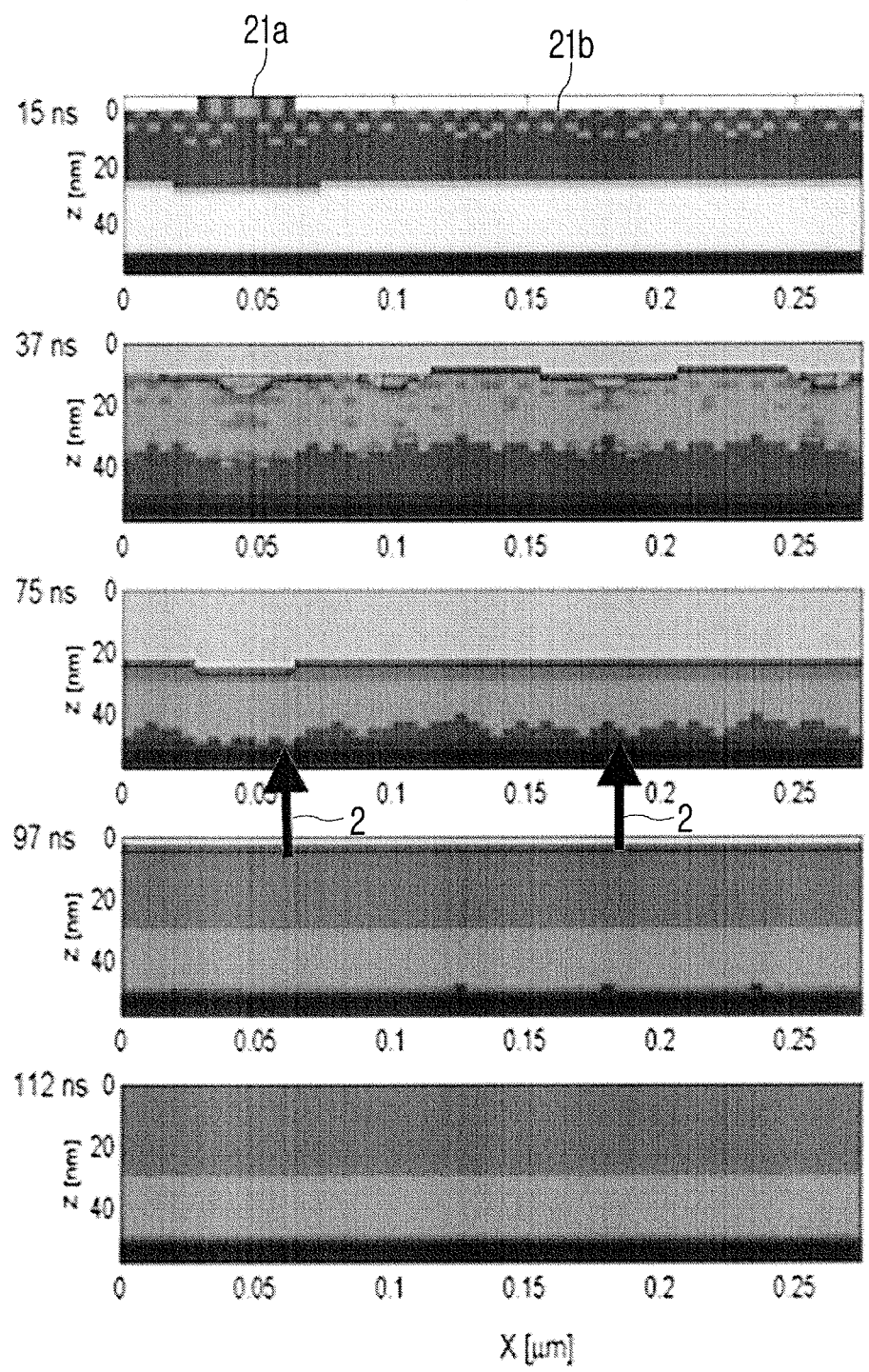
FIG. 12 is a view illustrating a crystallization state of a polycrystalline silicon layer when a pitch of first protrusions and depressions is 301 nm, according to an exemplary embodiment of the present invention.
Figure 13:
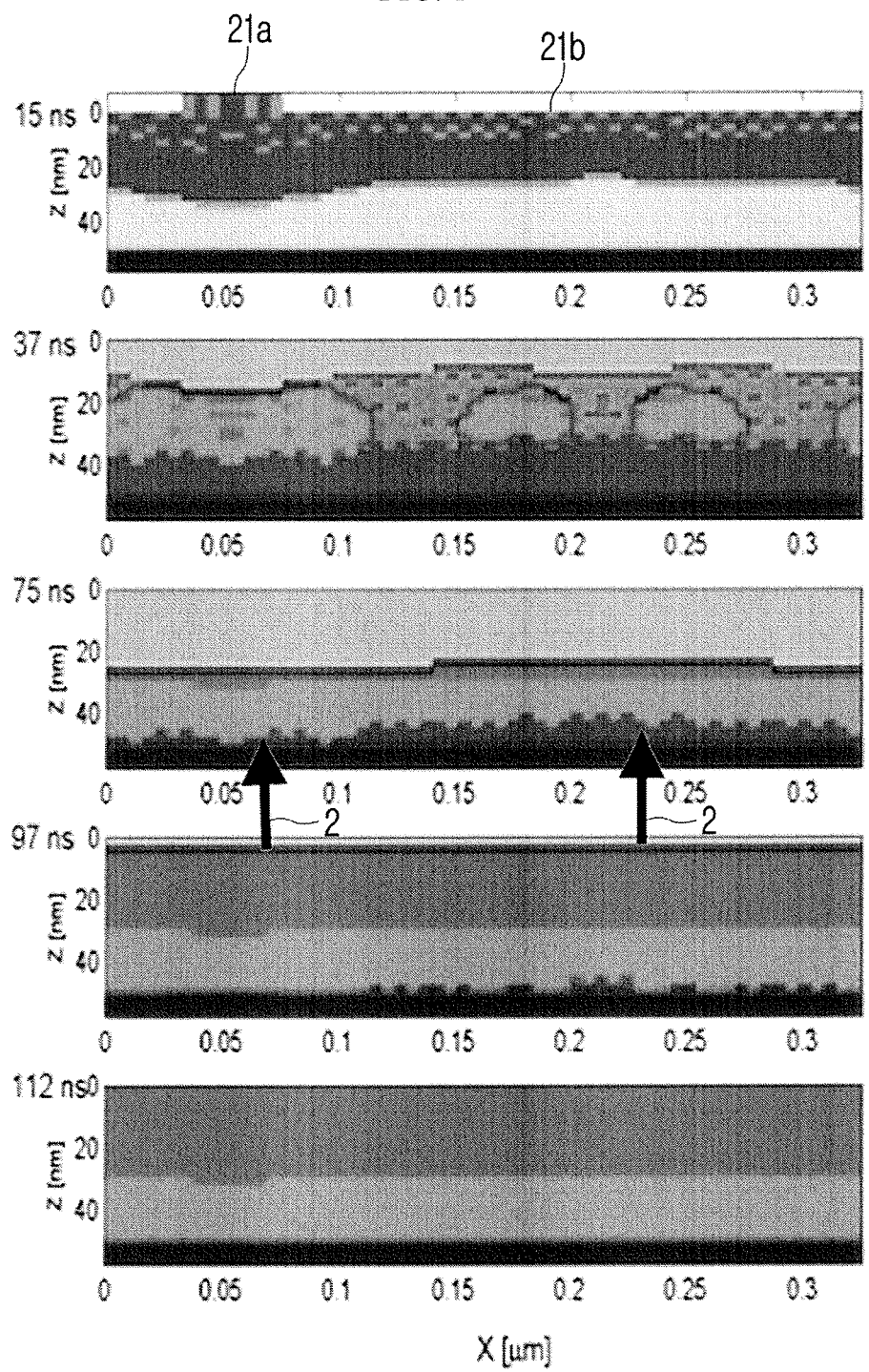
FIG. 13 is a view illustrating a crystallization state of a polycrystalline silicon layer when a pitch of first protrusions and depressions is 313 nm, according to an exemplary embodiment of the present invention.

FIG. 9 is a view illustrating a crystallization state of a polycrystalline silicon layer when a pitch of first protrusions and depressions is the same as a wavelength of a laser beam, according to an exemplary embodiment of the present invention. FIG. 10 is a view illustrating a crystallization state of a polycrystalline silicon layer when a pitch of first protrusions and depressions is 302 nm, according to an exemplary embodiment of the present invention. FIG. 11 is a view illustrating a crystallization state of a polycrystalline silicon layer when a pitch of first protrusions and depressions is 312 nm, according to an exemplary embodiment of the present invention. FIG. 12 is a view illustrating a crystallization state of a polycrystalline silicon layer when a pitch of first protrusions and depressions is 301 nm, according to an exemplary embodiment of the present invention. FIG. 13 is a view illustrating a crystallization state of a polycrystalline silicon layer when a pitch of first protrusions and depressions is 313 nm, according to an exemplary embodiment of the present invention.

FIG. 9, FIG. 10, FIG. 11, FIG. 12, and FIG. 13 illustrate the crystallization state in the width direction X and a thickness direction Z of the amorphous silicon layer 20 depending on time passage of 15 ns, 37 ns, 75 ns, 97 ns, and 120 ns. The direction Z, along which a thickness of the amorphous silicon layer 20 is measured, is orthogonal to the directions X and Y.

As shown in FIG. 9, when the wavelength of the laser beam 1 is 307 nm and the pitch P of the first protrusions and depressions 21 is 307 nm, a seed 2 is generated at a constant position inside the amorphous silicon layer 20. For example, the constant positions inside the amorphous silicon layer 20 may include a plurality of locations of the amorphous silicon layer 20 which correspond to the recess portions 21b of the first protrusions and depressions 21. In other words, the seeds 2 are generated to be uniformly spaced inside the amorphous silicon layer 20. The grain 3 is gradually grown from the seed 2, and then the grain 3 is positioned at the convex portion 21a of the first protrusions and depressions 21. For example, a grain 3 grows from a seed 2 located in an area of the amorphous silicon layer 20 corresponding to a recess portion 21b into two neighboring convex portions 21a.

Also, as shown in FIG. 10, when the wavelength of the laser beam 1 is 307 nm and the pitch P of the first protrusions and depressions 21 is 302 nm, the seed 2 is generated at the constant position inside the amorphous silicon layer 20. In other words, the seeds 2 are generated to be uniformly spaced inside the amorphous silicon layer 20. Also, as shown in FIG. 11, when the wavelength of the laser beam 1 is 307 nm and the pitch P of the first protrusions and depressions 21 is 312 nm, t the seed 2 is generated at the constant position inside the amorphous silicon layer 20. In other words, the seeds 2 are generated to be uniformly spaced inside the amorphous silicon layer 20.

However, as shown in FIG. 12, when the wavelength of the laser beam 1 is 307 nm and the pitch P of the first protrusions and depressions 21 is 301 nm, the seed 2 is randomly generated at several the amorphous silicon layer 20 that do not correspond to the recess portions 21b. Also, as shown in FIG. 13, when the wavelength of the laser beam 1 is 307 nm and the pitch P of the first protrusions and depressions 21 is 313 nm, the seed 2 is randomly generated at several parts of the amorphous silicon layer 20 that do not correspond to the recess portions 21b.

As described above, when the wavelength of the laser beam 1 is referred to as $\lambda$ and the pitch P of the first protrusions and depressions 21 has the value ranging from $\lambda-5$ nm to $\lambda+5$ nm, the seed may be generated in portions of the amorphous silicon layer 20 that correspond to the recess portions 21b of the first protrusions and depressions 21.

Accordingly, the pitch P of the first protrusions and depressions 21 is selected to have a size that increases a uniformity of the grains 3 formed in polycrystalline silicon layer 20', and the wavelength of the laser beam 1 may be selected in consideration of the pitch P to increase the uniformity of grains 3 formed in the polycrystalline silicon layer 20'. For example, when the wavelength of the laser beam 1 is selected as an integer multiple of the pitch P of the first protrusions and depressions 21, the seeds 2 may be generated at the locations of the amorphous silicon layer 20 that correspond to the recess portions 21b of the first protrusions and depressions 21. According to an exemplary embodiment of the present invention, the integer multiple of the pitch P is 1. For example, the pitch P of the first protrusions and depressions 21 and the wavelength 2 of the laser beam 1 may be equal.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A laser crystallization method comprising:
    forming a plurality of first protrusions and depressions on a surface of an amorphous silicon layer, wherein a first protrusion and an adjacent first depression of the plurality of first protrusions and depressions, together, have a first pitch; and
    irradiating the amorphous silicon layer with a laser beam to form a polycrystalline silicon layer,
    wherein grain boundaries of the polycrystalline silicon layer extend from a bottom surface of the polycrystalline silicon layer to a top of the plurality of first protrusions.

2. The laser crystallization method of claim 1, wherein the forming of the plurality of first protrusions and depressions includes:
    forming an insulating layer on the amorphous silicon layer;
    forming a plurality of openings having a first width on the insulating layer; and
    etching the surface of the amorphous silicon layer using the insulating layer as an etching mask.

3. The laser crystallization method of claim 2, wherein the forming of the plurality of openings includes:
    pressing the insulating layer with a nanoimprinter having a plurality of second protrusions and depressions to form a plurality of grooves on the insulating layer, wherein a second protrusion and an adjacent second depression of the plurality of second protrusions and depressions, together, have the first pitch; and
    performing an ashing process to the insulating layer to change the plurality of grooves into the plurality of openings.

4. The laser crystallization method of claim 1, wherein when the wavelength of the laser beam is referred to as $\lambda$, the first pitch is in a range from $\lambda-5$ nm to $\lambda+5$ nm.

5. The laser crystallization method of claim 4, wherein the first protrusions and depressions include a convex portion and a recess portion disposed adjacent to the convex portion, wherein the first pitch is a sum of a width of the convex portion and a width of the adjacent recess portion.

6. The laser crystallization method of claim 1, wherein the first pitch is in a range of about 305 nm to about 313 nm.

7. The laser crystallization method of claim 5, wherein the laser beam has a linear shape of which a length is longer than a width, the first protrusion and the adjacent first depression of the plurality of first protrusions and depressions have a linear shape of which a length is longer than the first pitch, and
    a direction in which the width of the laser beam is measured is parallel to a direction in which the first pitch is measured.

8. The laser crystallization method of claim 1, wherein a wavelength of the laser beam is an integer multiple of the first pitch.

9. A laser crystallization method comprising:
    forming an amorphous silicon layer on a substrate;
    forming an insulating layer on the amorphous silicon layer;
    pressing an imprinter on the insulating layer; and
    etching the amorphous silicon layer using the pressed insulating layer as a mask to form a first convex portion, a first recess portion, and a second convex portion on a first surface of the amorphous silicon layer, wherein the first convex portion is adjacent to the first recess portion, and the first recess portion is adjacent to the second convex portion; and
    irradiating the amorphous silicon layer with a laser beam to form a polycrystalline silicon layer,
    wherein a first seed is generated in the first recess portion when the amorphous silicon layer is irradiated by the laser beam.

10. The laser crystallization method of claim 9, wherein the first seed is grown into a first grain when the amorphous silicon layer is irradiated by the laser beam, and
    wherein the first convex portion corresponds to a first boundary of the first grain.

11. The laser crystallization method of claim 10, wherein the second convex portion corresponds to a second boundary of the first grain.

12. The laser crystallization method of claim 10, further comprising forming a second recess portion adjacent to the second convex portion and forming a third convex portion adjacent to the second recess portion on the first surface of the of the amorphous silicon layer, wherein a second seed is generated in the second recess portion when the amorphous silicon layer is irradiated by the laser beam, wherein a first pitch is a width of the first convex portion and a width of the first recess portion, and a second pitch which is equal to the first pitch is a width of the second convex portion and a width of the second recess portion.

13. The laser crystallization method of claim 12, wherein the first and second recess portions are closer to a second surface of the amorphous silicon layer than the first, second and third convex portions, wherein the first and second surfaces of the amorphous silicon layer are opposite with respect to each other.

14. The laser crystallization method of claim 9, wherein a first pitch is a width of the first convex portion and a width of the first recess portion, and a wavelength of the laser beam equals the first pitch.

15. The laser crystallization method of claim 9, wherein, when a first pitch is a width of the first convex portion and a width of the first recess portion, a wavelength of the laser beam is 307 nm and the first pitch ranges from about 302 nm to about 312 nm.

16. The laser crystallization method of claim 9, wherein, when irradiating the amorphous silicon layer with the laser beam, a first temperature of a portion of the amorphous silicon layer corresponding to the first recess portion is lower than a second temperature of a portion of the amorphous silicon layer corresponding to the first convex portion.

17. A laser crystallization method comprising:
forming an amorphous silicon layer on a substrate;
forming an insulating layer on the amorphous silicon layer;
forming a plurality of first convex portions and a plurality of first recess portions on the insulating layer by pressing a nanoimprinter on the insulating layer, wherein the nanoimprinter has a plurality of second convex portions and a plurality of second recess portions corresponding to the plurality of first convex portions and the plurality of first recess portions;
etching the amorphous silicon layer using the insulating layer as an etching mask, wherein a plurality of third recess portions and a plurality of third convex portions remain on the amorphous silicon layer after the etching of the amorphous silicon layer, wherein the plurality of third recess portions and the plurality of third convex portions are alternately disposed; and
irradiating the amorphous silicon layer with a laser beam to form a polycrystalline silicon layer,
wherein a plurality of grains are respectively formed in the plurality of third recess portions when the amorphous silicon layer is irradiated by the laser beam.

18. The laser crystallization method of claim 17, wherein, when a first pitch is a width of a third recess portion of the plurality of third recess portions and a width of a third convex portion of the plurality of third convex portions, the first pitch ranges from about 5 nm smaller than a wavelength of the laser beam to about 5 nm greater than the wavelength of the laser beam.

19. The laser crystallization method of claim 17, wherein a boundary of a first grain of the plurality of grains is disposed in a third convex portion adjacent to the third recess portion in which the first grain is disposed.

* * * * *